(12) United States Patent
Wang et al.

(10) Patent No.: US 10,990,144 B2
(45) Date of Patent: Apr. 27, 2021

(54) SYSTEMS AND METHODS FOR BUOYANCY-ASSISTED IMMERSION SERVER MAINTENANCE

(71) Applicant: Dell Products L.P., Round Rock, TX (US)

(72) Inventors: Nan Wang, Shanghai (CN); Austin M. Shelnutt, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 16/185,323

(22) Filed: Nov. 9, 2018

(65) Prior Publication Data

US 2020/0150731 A1 May 14, 2020

(51) Int. Cl.
*G06F 1/20* (2006.01)
*G05B 19/416* (2006.01)

(52) U.S. Cl.
CPC .......... *G06F 1/206* (2013.01); *G05B 19/416* (2013.01); *G05B 2219/49215* (2013.01)

(58) Field of Classification Search
CPC .......... G06F 1/206; G05B 2219/49215; G05B 19/416
See application file for complete search history.

(56) References Cited

U.S. PATENT DOCUMENTS

| | | | | |
|---|---|---|---|---|
| 2014/0099433 A1* | 4/2014 | Nam | ................... | C23C 18/1675 427/99.5 |
| 2019/0325668 A1* | 10/2019 | Cole | ....................... | B08B 9/023 |
| 2019/0357385 A1* | 11/2019 | Miyazaki | ........... | H05K 7/20236 |

* cited by examiner

*Primary Examiner* — Chad G Erdman
(74) *Attorney, Agent, or Firm* — Jackson Walker L.L.P.

(57) ABSTRACT

A system may include a tank configured to hold a dielectric liquid, a rack located within the tank and having a plurality of bays, each bay configured to receive a corresponding device, an air pump configured to drive an air flow, at least one variable-buoyancy chamber mechanically coupled to at least one of the tank and the rack, each of the at least one variable-buoyancy chamber comprising a fluidically-sealed plenum and wherein the at least one variable-buoyancy chamber is configured to mechanically couple to a device-in-service, and a control subsystem configured to control a buoyancy of the at least one variable-buoyancy chamber in order to cause movement of the device-in-service relative to the rack.

18 Claims, 5 Drawing Sheets

SYSTEMS AND METHODS FOR BUOYANCY-ASSISTED IMMERSION SERVER MAINTENANCE

TECHNICAL FIELD

The present disclosure relates in general to information handling systems, and more particularly to servicing of liquid-immersion cooled information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

However, in some instances, some information handling systems may generate a high level of heat such that traditional air mover-based cooling solutions may be insufficient to provide adequate cooling. In such instances, liquid cooling of information handling systems may be preferred, including a technique known as liquid-immersion cooling. In liquid-immersion cooling, an information handling system server rack may be filled with a dielectric liquid (e.g., an electrically-nonconductive oil) and individual information handling system servers may be vertically inserted into the rack. Such dielectric fluid may be actively cooled (e.g., using known liquid refrigeration techniques) and in operation, heat may be transferred from the information handling system servers to the dielectric liquid, thus cooling the information handling system servers and their constituent components.

Traditional approaches provide two main techniques to maintain and service information handling system servers in a liquid-immersion cooled server rack. One such technique is manual operation, whereby one or more persons physically insert and remove the information handling system servers. However, such approach has many disadvantages. First, the weight of some servers (e.g., 45 kilograms for 2U servers) renders it difficult for one operator to lift the server. Second, servers may have chassis depths of about 80 centimeters, further causing difficulty for a human operator to lift a server out of the server rack, and practically limits the length of a server chassis. Third, such manual insertion and removal by a person requires that such person touch the oil, which may introduce contaminants into the oil and a datacenter environment, as well as negatively affect the safety and health of such person.

A second traditional approach is the use of a mechanical cable and pulley system, which also has many disadvantages. For example, the use of such a mechanical system may require more space in a datacenter room, decreasing the physical capacity of the datacenter to house servers. As another example, such a system requires a motor drive subsystem to insert and remove a server from the rack, which requires significant electrical energy, has a significant economic cost, and requires a significant amount of physical space. As a further example, because a cable and/or chain may be flexible, a pulley system may not be able to accurately locate a server and vertically remove a server without influencing a server adjacent to the server being maintained or serviced, and such pulley system may have difficulty in controlling the removal or insertion of both sides of a server at the same rate, potentially causing a server to lean in one direction and cause damage to the server, the server rack, and/or other components. Additionally, such an approach does not entirely avoid the need to have a human operator to manually handle the server (e.g., a human operator may still need to hold the server and manipulate its position to lay the server on a bench for servicing and maintenance), and thus may still include many disadvantages of the manual approach described above. Further, such an approach may require that the human operator decouple a cable and/or chain from the server, which may be in a highly-elevated position difficult for a human operator to reach.

SUMMARY

In accordance with the teachings of the present disclosure, the disadvantages and problems associated with maintaining liquid-immersion cooled information handling systems.

In accordance with embodiments of the present disclosure, a system may include a tank configured to hold a dielectric liquid, a rack located within the tank and having a plurality of bays, each bay configured to receive a corresponding device, an air pump configured to drive an air flow, at least one variable-buoyancy chamber mechanically coupled to at least one of the tank and the rack, each of the at least one variable-buoyancy chamber comprising a fluidically-sealed plenum and wherein the at least one variable-buoyancy chamber is configured to mechanically couple to a device-in-service, and a control subsystem configured to control a buoyancy of the at least one variable-buoyancy chamber in order to cause movement of the device-in-service relative to the rack.

In accordance with these and other embodiments of the present disclosure, a method may be provided for use in a system comprising a tank configured to hold a dielectric liquid, a rack located within the tank and having a plurality of bays, each bay configured to receive a corresponding device, an air pump configured to drive an air flow, and at least one variable-buoyancy chamber mechanically coupled to at least one of the tank and the rack, each of the at least one variable-buoyancy chamber comprising a fluidically-sealed plenum and wherein the at least one variable-buoyancy chamber is configured to mechanically couple to a device-in-service. The method may include controlling a buoyancy of the at least one variable-buoyancy chamber in order to cause movement of the device-in-service relative to the rack.

In accordance with these and other embodiments of the present disclosure, a device may include electronic components and a buoyancy element comprising a gas-filled, enclosed plenum fluidically sealed to prevent transfer of liquid or gas between the exterior and interior of such enclosed plenum.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electro-magnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
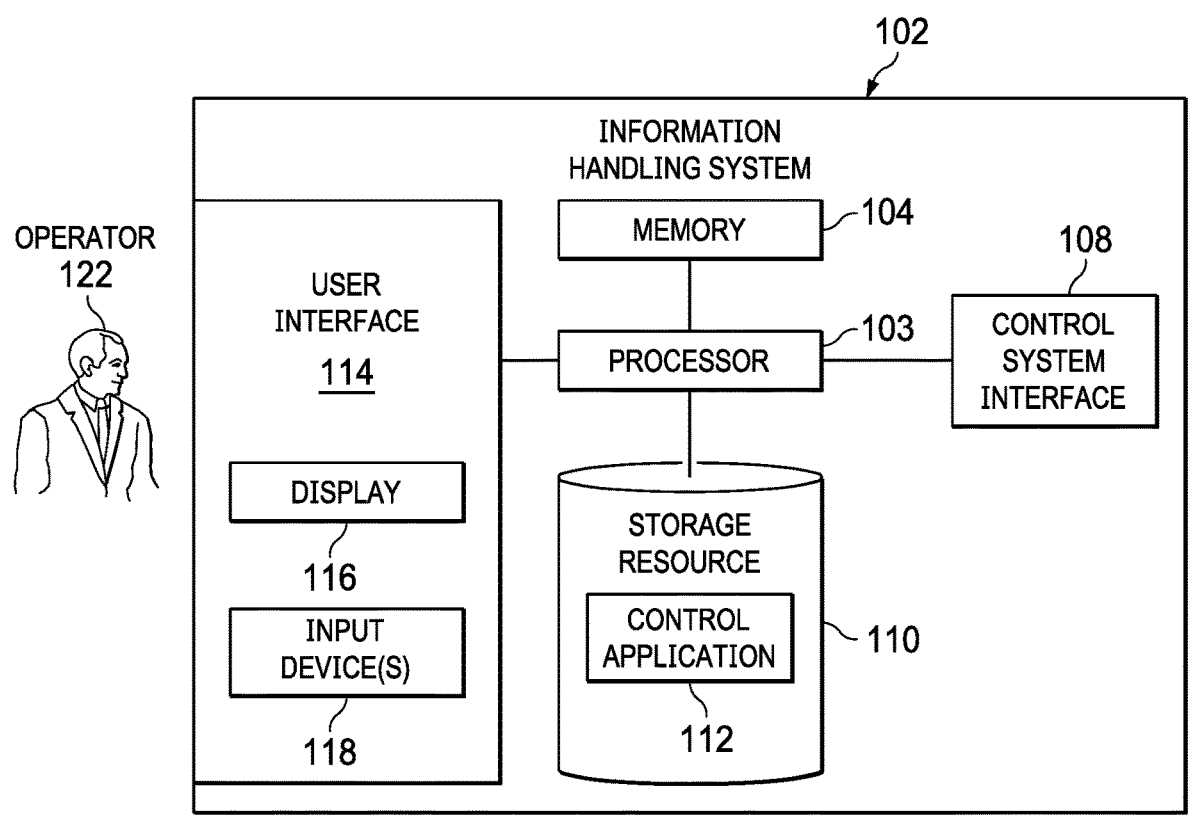
FIG. 1 illustrates a block diagram of an example information handling system, in accordance with embodiments of the present disclosure.

FIG. 1 illustrates a block diagram of an example information handling system 102, in accordance with embodiments of the present disclosure. In certain embodiments, information handling system 102 may comprise a personal computer (e.g., a desktop computer or a portable computer). In these and other embodiments, information handling system 102 may comprise a mobile device (e.g., smart phone, a tablet computing device, a handheld computing device, a personal digital assistant, or any other device that may be readily transported on a person of a user of such mobile device).

As depicted in FIG. 1, information handling system 102 may include a processor 103, a memory 104 communicatively coupled to processor 103, a storage resource 110 communicatively coupled to processor 103, a user interface 114 communicatively coupled to processor 103 and a control system interface 108 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in its memory 104, storage resource 110, and/or another component of information handling system 102.

Memory 104 may be communicatively coupled to its associated processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

Storage resource 110 may include any system, device, or apparatus configured to store data. A storage resource 110 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 110 may include one or more storage enclosures configured to hold and/or power one or more of such devices. In the embodiments represented by FIG. 1, storage resource 110 may reside within its associated information handling system 102. However, in other embodiments, storage resource 110 may reside external to its associated information handling system 102 (e.g., may be coupled to information handling system 102 via a network).

As shown in FIG. 1, a storage resource 110 may have stored thereon a control application 112. Control application 112 may comprise a program of instructions which a processor 103 may read and execute to receive control instructions input by an operator via input device(s) 118 of user interface 114, and translate and communicate such control instructions to control system interface 108, which may in turn control operation of a buoyancy-assisted maintenance system communicatively coupled to control system interface 108, as described in greater detail below. Although control application 112 is depicted in FIG. 1 as being locally stored on a storage resource 110 of an information handling system 102, in some embodiments, control application 112 may be stored externally or remotely from an information handling system 102 and accessible to such information handling system 102 via a network, and loaded by processor 103 from such network (e.g., such control application 112 may be a streaming application).

User interface 114 may comprise any instrumentality or aggregation of instrumentalities by which an operator 122 may interact with information handling system 102. For example, user interface 114 may permit a user to input data and/or instructions into information handling system 102 via one or more input devices 118 (e.g., a keypad, keyboard, touch screen, microphone, and/or other data input device), and/or otherwise manipulate information handling system 102 and its associated components. User interface 114 may also permit information handling system 102 to communicate data to operator 122 via a display 116. Display 116 may comprise any suitable system, device, or apparatus configured to display human-perceptible graphical data and/or alphanumeric data to operator 122. For example, in some embodiments, display 116 may comprise a liquid crystal display.

Control system interface 108 may comprise any system, device, or apparatus configured to interface between processor 103 and one or more components of a buoyancy-assisted maintenance system (such as shown in FIGS. 2A-2D below), to communicate control signals for enabling control application 112 to control operation of such buoyancy-assisted maintenance system, as described in greater detail below.

In addition to processor 103, memory 104, storage resource 110, user interface 114, and control system interface 108, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

FIGS. 2A-2D each illustrate a perspective view of selected components of a system 200 for buoyancy-assisted maintenance of a device in a liquid-immersion cooling system, in accordance with embodiments of the present disclosure. As shown in FIGS. 2A-2D, buoyancy-assisted maintenance system 200 may include a tank 202, a rack 204 configured to house a plurality of devices 206, two variable-buoyancy chambers 208, mechanical rails 210, device supports 212, and air pump 214.

Tank 202 may include any suitable vessel for containing a dielectric liquid (e.g., a generally non-electrically conductive oil). Housed within tank 202 may be rack 204 which may be configured to house a plurality of devices 206. In some embodiments, rack 204 may comprise an information handling system server rack, and devices 206 may comprise information handling system servers or "blades." However, the systems and methods disclosed herein are not limited to information handling system servers disposed in an information handling system server rack, and rack 204 may comprise any suitable enclosure and devices 206 may comprise any suitable device configured to be housed in rack 206. In some embodiments, rack 204 may have a plurality of bays (or slots), each bay configured to receive a device 206. Accordingly, each bay may comprise suitable mechanical structures for mechanically receiving a device 206 and may comprise suitable electrical components for electrically coupling device 206 to rack 204.

A variable-buoyancy chamber 208 may comprise any suitable enclosed plenum which may be fluidically sealed to prevent transfer of liquid or gas between the exterior and interior of such enclosed plenum, except for gas (e.g., air) that may be pumped into the variable-buoyancy chamber 208 by air pump 214 and/or liquid that may pass through a liquid valve 216, as described in greater detail below. As shown in FIGS. 2A-2D, a variable-buoyancy chamber 208 may include rails 210, a liquid valve 216, and a position sensor 218. Rails 210 may comprise any suitable mechanical structure that may mechanically couple to respective rails 210 coupled to rack 204 (as shown in FIGS. 2A-2D) and/or coupled to tank 202. Rails 210 may be configured so as to guide and constrain motion of variable-buoyancy chamber 208 relative to rack 204 in an upward direction or downward direction. As used herein "upward" may refer to a direction opposite to that of the force of gravity while "downward" may refer to a direction of the force of gravity.

A liquid valve 216 may include any device, system or apparatus that regulates, directs, and/or controls the flow of a fluid (e.g., the dielectric fluid contained in tank 202) by opening, closing, or partially obstructing one or more passageways. When liquid valve 216 is open, coolant liquid may flow in a direction from higher pressure to lower pressure (e.g., from outside to inside variable-buoyancy chamber 208 or vice versa depending on the operation of air pump 214). The operation of liquid valve 216 (e.g., opening and closing, size of an aperture of liquid valve 216) may be controlled by control application 112. Although control system interface 108 of information handling system 102 may be communicatively coupled to liquid valve 216, such coupling is not shown in FIGS. 2A-2D for the purposes of clarity and exposition.

A position sensor 218 may include any device, system or apparatus that measures a vertical position of variable-buoyancy chamber 208 relative to rack 204 and/or tank 202, and generates an electrical signal indicative of such vertical position. In operation, position sensor 218 may communicate the electrical signal indicative of vertical position to control application 112, which may use the position indicated by such feedback signal to control operation of air pump 214 and/or liquid valve 216, as described in greater detail below.

Device supports 212 may include a plurality of lengthwise horizontally-oriented (e.g., perpendicular to the direction of the force of gravity) mechanical structures oriented in a direction parallel to the orientations of devices 206 in rack 204. Device supports 212 may serve as supporting structures for supporting a device 206 (e.g., for maintenance of service by a person) above the dielectric liquid contained in tank 202 in a horizontal orientation perpendicular to the vertical direction that such device 206 is oriented when inserted into rack 204. Operation of device supports 212 is be described in greater detail below. In some embodiments, device supports 212 may be mechanically movable horizontally in a direction perpendicular to the orientations of devices 206 in rack 204 such that device supports 212 may be placed in a desired position. In some embodiments, such movement of device supports 212 may be under the control of control application 112.

Air pump 214 may be fluidically coupled to variable-buoyancy chambers 208 via one or more fluidic conduits and may comprise any mechanical or electro-mechanical system, apparatus, or device operable to produce a flow of gas (e.g., a flow of ambient air). For example, air pump 214 may produce a flow of gas by applying a pressure to such gas. The operation of liquid valve 216 (e.g., opening and closing, size of an aperture of liquid valve 216) may be controlled by control application 112. Although control system interface 108 of information handling system 102 may be communicatively coupled to air pump 214, such coupling is not shown in FIGS. 2A-2D for the purposes of clarity and exposition.

In addition to the various components shown in FIG. 2 and described above, system 200 may include any other suitable components to undertake the functionality disclosed herein. For example, while FIG. 2 shows mechanical rails 210 for vertical movement of components of system 200 relative to one another, system 200 may also include mechanical rails and/or other mechanical components for horizontal movement of components of system 200 relative to one another.

The operation of buoyancy-assisted maintenance system 200 may be described in more detail below with reference to methods 300 and 400.

Figure 3:
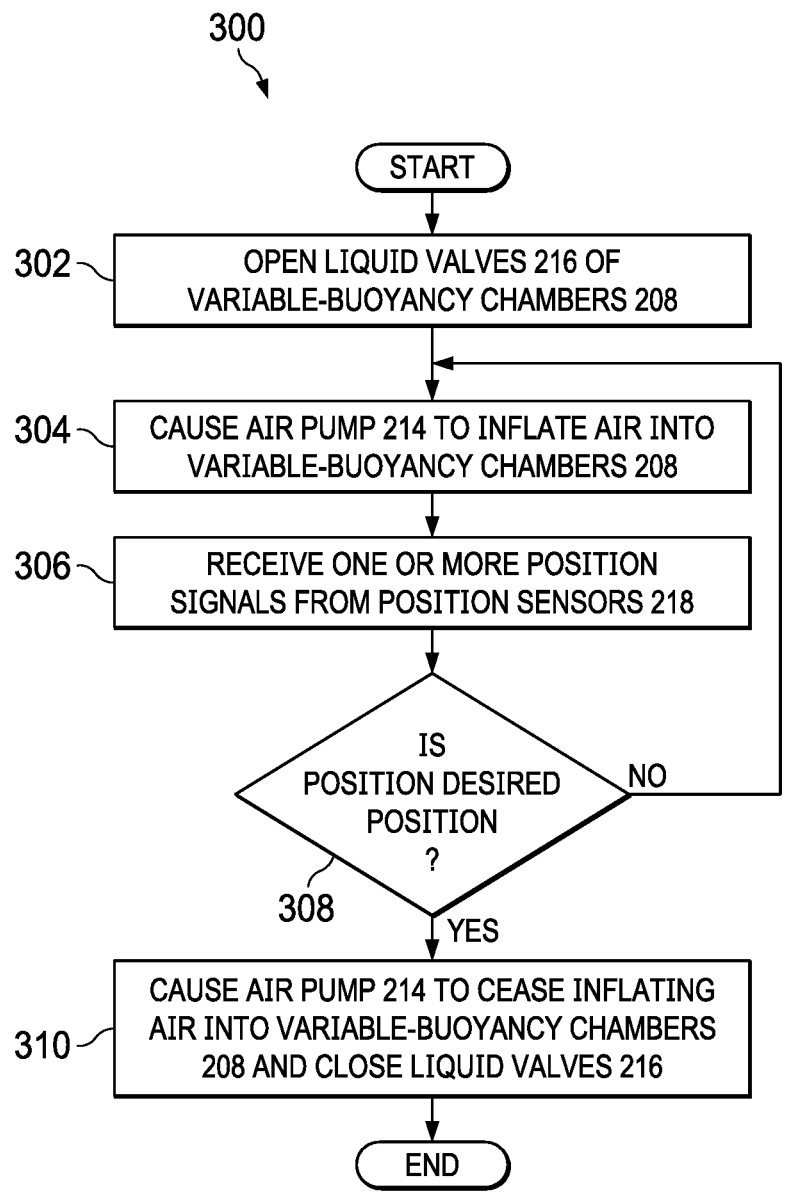
FIG. 3 illustrates a flow chart of an example method for buoyancy-assisted maintenance of a device in a liquid-immersion cooling system, in accordance with embodiments of the present disclosure.

FIG. 3 illustrates a flow chart of an example method 300 for buoyancy-assisted maintenance of a device in a liquid-immersion cooling system, in accordance with embodiments of the present disclosure. According to some embodiments, method 300 may begin at step 302. As noted above, teachings of the present disclosure may be implemented in a variety of configurations of information handling system 102 and buoyancy-assisted maintenance system 200. As such, the preferred initialization point for method 300 and the order of the steps comprising method 300 may depend on the implementation chosen.

Figure 2A:
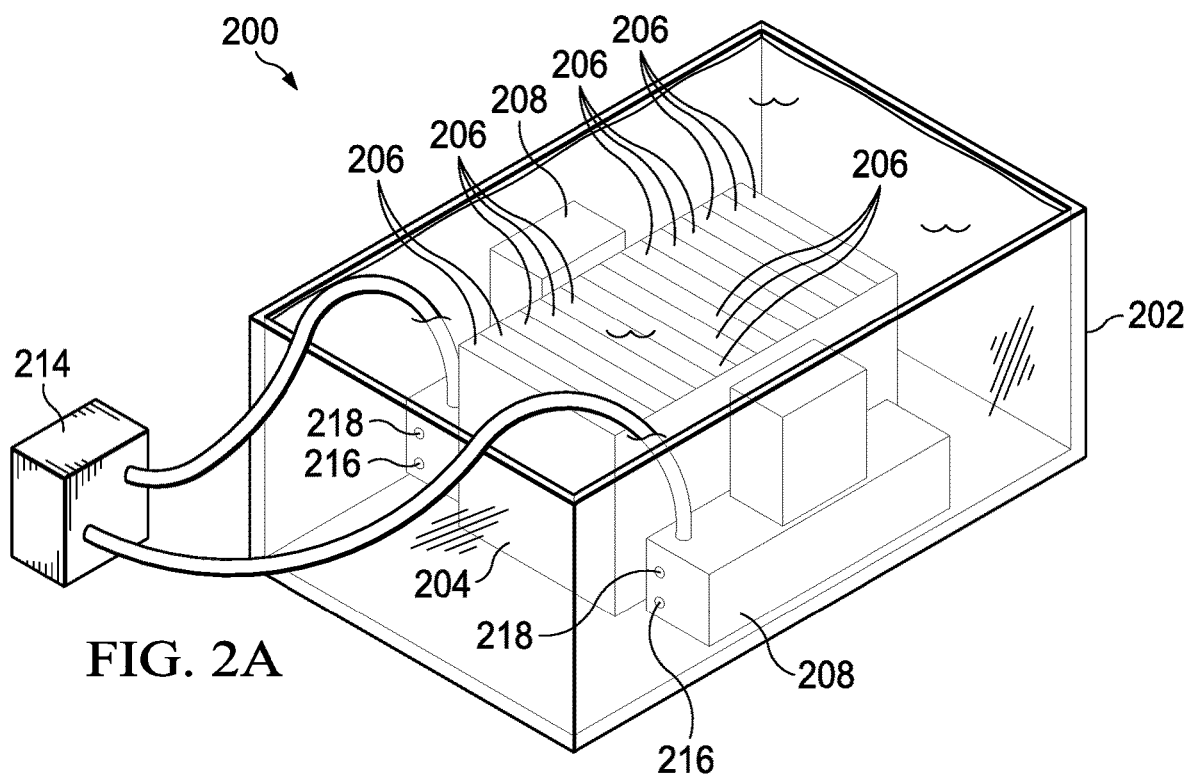
FIGS. 2A-2D each illustrate a perspective view of selected components of a system for buoyancy-assisted maintenance of a device in a liquid-immersion cooling system, in accordance with embodiments of the present disclosure.
Figure 2B:
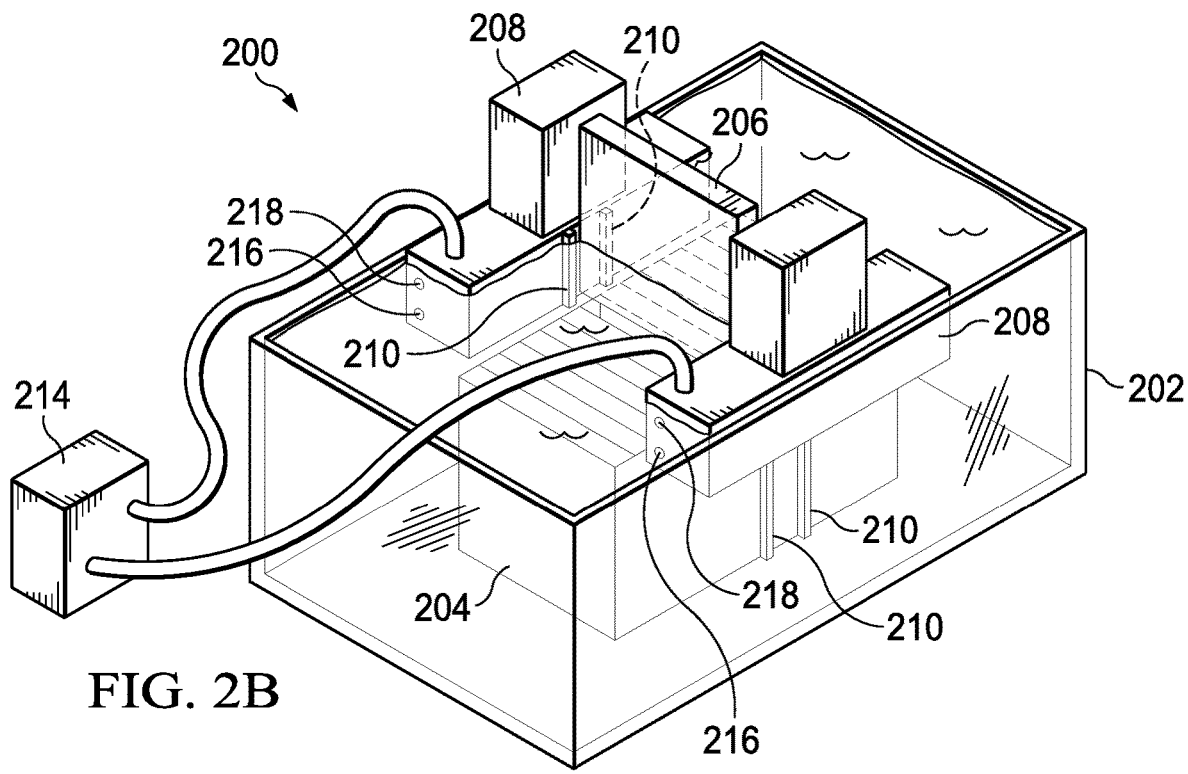
Figure 2C:
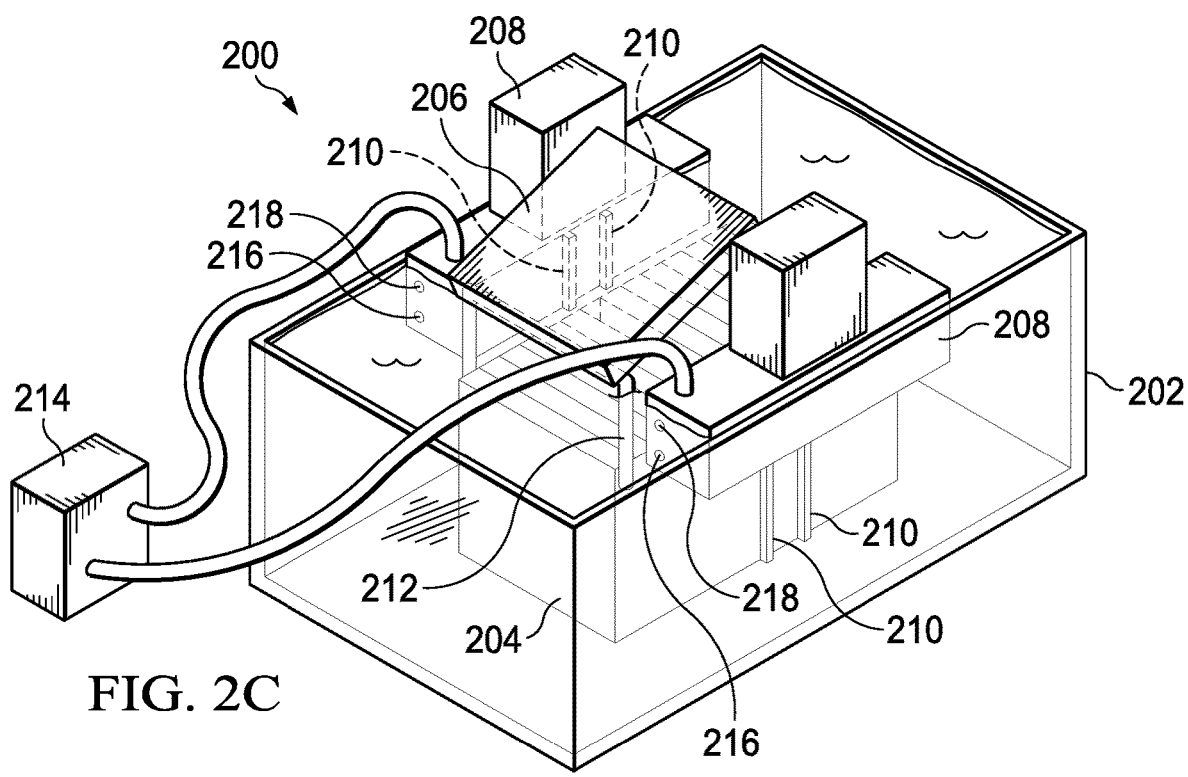
Figure 2D:
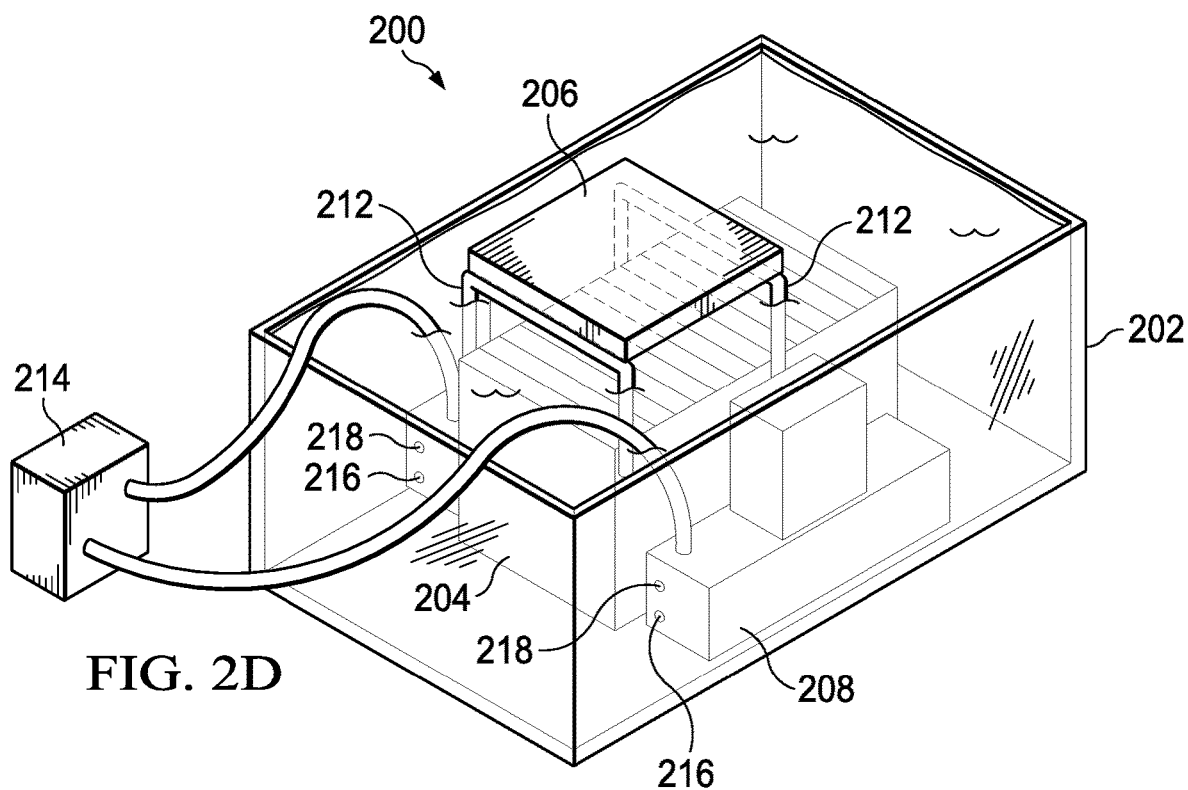

Method 300 may be performed by buoyancy-assisted maintenance system 200 when an operator 122 interacts with control application 112 to instruct control application 112 to remove a device 206 from rack 204 and/or instruct control application 112 to lift device 206 from device supports 212. Thus, method 300 may be used when either: (a) a device 206 to be maintained/serviced is inserted within rack 204 (as shown in FIG. 2A) and it is desired to remove device 206 from rack 204 or (b) maintenance/servicing of a device 206 resting upon device supports 212 (as shown in FIG. 2D), has completed, and it is desired to lift the device 206 from device supports 212 before lowering device 206 back into rack 204. It is assumed that at the beginning of method 300, mechanical features near the top of variable-buoyancy chambers 208 are coupled, either automatically (e.g., by control application 112) or manually, to corresponding mechanical features of a desired device 206, such that movement of variable-buoyancy chambers 208 causes corresponding movement of the desired device 206. In some embodiments, such coupling of variable-buoyancy chambers 208 to the desired device 206 may be rotatable, in the sense that desired device 206 may rotate relative to variable-buoyancy chambers 208 about an axis that runs through the points of coupling, thus allowing desired device 206 to rotate from the position shown in FIG. 2B, through the position shown in FIG. 2C, to the position shown in FIG. 2D, or vice versa.

At step 302, control application 112 may cause liquid valves 216 of variable-buoyancy chambers 208 to open. At step 304, control application 112 may cause air pump 214 to inflate air into variable-buoyancy chambers 208, the pressure of which may cause dielectric liquid within variable-buoyancy chambers 208 to drain into tank 202, thus increasing the buoyancies of variable-buoyancy chambers 208 and causing variable-buoyancy chambers 208 and the device 206 to which they are mechanically coupled to rise in an upward direction, either from the position shown in FIG. 2A to the position shown in FIG. 2B or from the position shown in FIG. 2D to the position shown in FIG. 2C.

At step 306, control application 112 may receive one or more signals from one or more position sensors 218. At step 308, control application 112 may determine if the position indicated by the one or more signals is a desired position. For example, when translating variable-buoyancy chambers 208 and a device 206 from a position shown in FIG. 2A to a position shown in FIG. 2B, the desired position may be one at which device 206 is removed entirely from rack 204 and the dielectric liquid within tank 202. As another example, when translating variable-buoyancy chambers 208 and a device 206 from a position shown in FIG. 2D to a position shown in FIG. 2C, the desired position may be one at which device 206 is lifted completely from device supports 212 and is oriented in a horizontal position above a corresponding bay of rack 204. If the detected position is the desired position, method 300 may proceed to step 310. Otherwise, method 300 may proceed again to step 304, and steps 304-308 may repeat until air pump 214 has pumped air into variable-buoyancy chambers 208 sufficient to increase buoyancy of variable-buoyancy chambers 208 to that necessary to reach the desired position.

At step 310, control application 112 may cause air pump 214 to cease inflating air into variable-buoyancy chambers 208 and cause liquid valves 216 to close, thus maintaining buoyancies of variable-buoyancy chambers 208 at a level to maintain the positions of variable-buoyancy chambers 208 at the desired position. After completion of step 310, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using control application 112, buoyancy-assisted maintenance system 200, and/or any other system operable to implement method 300. In certain embodiments, method 300 may be implemented partially or fully in software and/or firmware embodied in computer-readable media.

Figure 4:
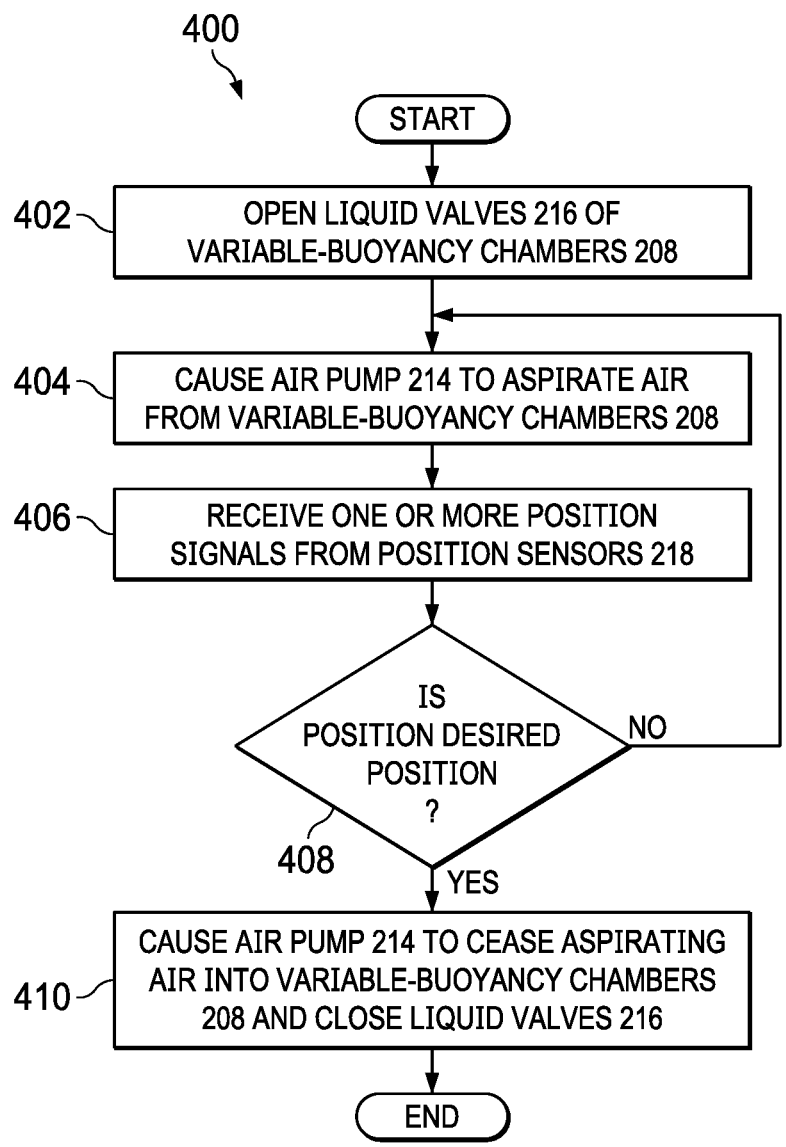
FIG. 4 illustrates a flow chart of another example method for buoyancy-assisted maintenance of a device in a liquid-immersion cooling system, in accordance with embodiments of the present disclosure.

FIG. 4 illustrates a flow chart of another example method 400 for buoyancy-assisted maintenance of a device in a liquid-immersion cooling system, in accordance with embodiments of the present disclosure. According to some embodiments, method 400 may begin at step 402. As noted above, teachings of the present disclosure may be implemented in a variety of configurations of information handling system 102 and buoyancy-assisted maintenance system 200. As such, the preferred initialization point for method 400 and the order of the steps comprising method 400 may depend on the implementation chosen.

Method 400 may be performed by buoyancy-assisted maintenance system 200 when an operator 122 interacts with control application 112 to instruct control application 112 to insert a device 206 into rack 204 and/or instruct control application 112 to lie device 206 down on device supports 212. Thus, method 400 may be used when either: (a) a device 206 to be maintained/serviced is removed from rack 204 (as shown in FIG. 2B) and it is desired to insert device 206 into rack 204 or (b) a device 206 to be maintained/serviced is removed from rack 204 and it is desired to rotate the device 206 relative to variable-buoyancy chambers 208 such that it rotates through the position shown in FIG. 2C to the position shown in FIG. 2D. It is assumed that at the beginning of method 400, mechanical features near the top of variable-buoyancy chambers 208 are coupled, either automatically (e.g., by control application 112) or manually, to corresponding mechanical features of a desired device 206, such that movement of variable-buoyancy chambers 208 causes corresponding movement of the desired device 206. At step 402, control application 112 may cause liquid valves 216 of variable-buoyancy chambers 208 to open, allowing the dielectric liquid present in tank 202 to flow into variable-buoyancy chambers 208. At step 404, control application 112 may cause air pump 214 to aspirate air from variable-buoyancy chambers 208, the pressure of which may further cause dielectric liquid within tank 202 to enter into variable-buoyancy chambers 208 via liquid valves 216, thus decreasing the buoyancies of variable-buoyancy chambers 208 and causing variable-buoyancy chambers 208 and the device 206 to which they are mechanically coupled to lower in a downward direction, either from the position shown in FIG. 2B to the position shown in FIG. 2A or from the position shown in FIG. 2B, through the position shown in FIG. 2C, to the position shown in FIG. 2D.

At step 406, control application 112 may receive one or more signals from one or more position sensors 218. At step 408, control application 112 may determine if the position indicated by the one or more signals is a desired position. For example, when translating variable-buoyancy chambers 208 and a device 206 from a position shown in FIG. 2B to a position shown in FIG. 2A, the desired position may be one at which device 206 is inserted fully into rack 204. As another example, when translating variable-buoyancy chambers 208 and a device 206 from a position shown in FIG. 2B to positions shown in FIGS. 2C and 2D, the desired position may be one at which device 206 is lowered completely onto device supports 212. If the detected position is the desired position, method 400 may proceed to step 410. Otherwise, method 400 may proceed again to step 404, and steps 404-408 may repeat until air pump 214 has aspirated air from variable-buoyancy chambers 208 sufficient to decrease buoyancy of variable-buoyancy chambers 208 to that necessary to reach the desired position.

At step 410, control application 112 may cause air pump 214 to cease aspirating air from variable-buoyancy chambers 208 and cause liquid valves 216 to close, thus maintaining buoyancies of variable-buoyancy chambers 208 at a level to maintain the positions of variable-buoyancy chambers 208 at the desired position. After completion of step 410, method 400 may end.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using control application 112, buoyancy-assisted maintenance system 200, and/or any other system operable to implement method 400. In certain embodiments, method 400 may be implemented partially or fully in software and/or firmware embodied in computer-readable media.

Figure 5:
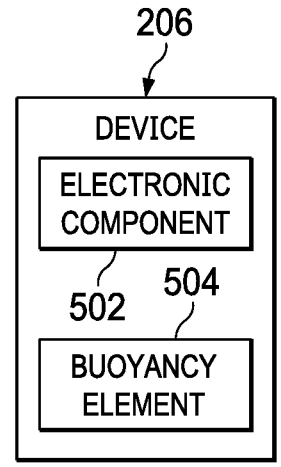
FIG. 5 illustrates a block diagram of a device having neutral-buoyancy features, in accordance with embodiments of the present disclosure.

FIG. 5 illustrates a block diagram of a device 206 having neutral-buoyancy features, in accordance with embodiments of the present disclosure. As shown in FIG. 5, a device 206 may have electronic components 502 (as would be present in an information handling system server) and a buoyancy element 504. Buoyancy element 504 may comprise any suitable air-filled, enclosed plenum (e.g., a plastic bag) which may be fluidically sealed to prevent transfer of liquid or gas between the exterior and interior of such enclosed plenum. Buoyancy element 504 may be sized and/or filled with a volume of air based on a mass of device 206 such that device 206 may have a neutral buoyancy relative to dielectric liquid of tank 202. Such neutral buoyancy may render it less difficult for an operator to remove device 206 from and/or insert device 206 into rack 204. In some embodiments, a device with a buoyancy element 504 may be used in connection with buoyancy-assisted maintenance system 200.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a tank configured to hold a dielectric liquid;
a rack, horizontally oriented and located within the tank and having a plurality of bays, each bay vertically oriented and configured to receive a corresponding device;
an air pump configured to drive an air flow;
two or more variable-buoyancy chambers mechanically coupled to at least one of the tank and the rack, each of the variable-buoyancy chambers comprising a fluidically-sealed plenum and wherein the at two or more variable-buoyancy chambers include a first variable-buoyancy chamber and a second variable-buoyancy chamber, wherein the first variable-buoyancy changer is configured to mechanically couple to a first mechanical coupling of a device-in-service and wherein the second variable-buoyancy chamber is configured to mechanically couple to a second mechanical coupling of a device-in-service; and
a control subsystem configured to control a buoyancy of the first and second variable-buoyancy chambers in order to cause the device-in-service to:
move vertically relative to the rack; and
to rotate relative to the rack between a vertical orientation and a horizontal orientation.

2. The system of claim 1, wherein the device-in-service is an information handling system server.

3. The system of claim 1, wherein the dielectric liquid is an oil.

4. The system of claim 1, wherein the control subsystem is configured to control the buoyancy of the first and second variable-buoyancy chambers to lift the device-in-service from a bay of the rack.

5. The system of claim 1, wherein the control subsystem is configured to control the buoyancy of the first and second variable-buoyancy chambers to lower the device-in-service into a bay of the rack.

6. The system of claim 1, wherein the control subsystem is configured to cause the device-in-service to rotate relative to the rack from a vertical orientation to a horizontal orientation.

7. The system of claim 1, wherein the control subsystem is configured to cause the device-in-service to rotate relative to the rack from a horizontal orientation to a vertical orientation.

8. The system of claim 1, wherein:
the at least one variable-buoyancy chamber further comprises:
a liquid valve configured to control flow of dielectric liquid between an interior of the fluidically-sealed plenum and an exterior of the fluidically-sealed plenum and vice versa; and
an air pump interface coupled to the air pump through which the air flow driven by the air pump may flow; and
the control system is configured to control the air pump and the liquid valve to control the buoyancy.

9. The system of claim 1, wherein the device-in-service comprises a buoyancy element comprising a gas-filled, enclosed plenum fluidically sealed to prevent transfer of liquid or gas between the exterior and interior of such enclosed plenum.

10. The system of claim 1, wherein the buoyancy element is sized such that its buoyancy is based on a mass of the device-in-service and such that the device-in-service has a neutral buoyancy with respect to the dielectric liquid.

11. A method comprising, in a system comprising a tank configured to hold a dielectric liquid, a horizontally oriented rack located within the tank and having a plurality of bays, each bay vertically oriented and configured to receive a corresponding device, an air pump configured to drive an air flow, and first and second variable-buoyancy chambers mechanically coupled to at least one of the tank and the rack, each of the first and second variable-buoyancy chambers comprising a fluidically-sealed plenum and wherein the first and second variable-buoyancy chambers are each configured to mechanically couple to a device-in-service:
controlling a buoyancy of the first and second variable-buoyancy chambers in order to cause the device-in-service to:
move vertically relative to the rack; and
to rotate relative to the rack between a vertical orientation and a horizontal orientation.

12. The method of claim 11, wherein the device-in-service is an information handling system server.

13. The method of claim 11, wherein the dielectric liquid is an oil.

14. The method of claim 11, further comprising controlling the buoyancy of the variable-buoyancy chamber to lift the device-in-service from a bay of the rack.

15. The method of claim 11, further comprising controlling the buoyancy of the variable-buoyancy chamber to lower the device-in-service into a bay of the rack.

16. The method of claim 11, further comprising controlling the buoyancy of the variable-buoyancy chamber to cause the device-in-service to rotate relative to the rack from a vertical orientation to a horizontal orientation.

17. The method of claim 11, further comprising controlling the buoyancy of the variable-buoyancy chamber to cause the device-in-service to rotate relative to the rack from a horizontal orientation to a vertical orientation.

18. The method of claim 11, wherein:
  the each of the first and second variable-buoyancy chambers further comprises:
    a liquid valve configured to control flow of dielectric liquid between an interior of the fluidically-sealed plenum and an exterior of the fluidically-sealed plenum and vice versa; and
    an air pump interface coupled to the air pump through which the air flow driven by the air pump may flow; and
  the method further comprises controlling the air pump and the liquid valve to control the buoyancy.

* * * * *